United States Patent [19]
Takiguchi et al.

[11] Patent Number: 5,345,460
[45] Date of Patent: Sep. 6, 1994

[54] SEMICONDUCTOR LASER DEVICE WITH WINDOW REGIONS

[75] Inventors: Haruhisa Takiguchi, Nara; Seiki Yano, Yamatokoriyama; Kazuhiko Inoguchi, Nara; Hiroaki Kudo, Nara; Chitose Nakanishi, Nara; Toshiyuki Okumura, Tenri; Satoshi Sugahara, Nara, all of Japan

[73] Assignee: Sharp Kabushiki Kaisha, Osaka, Japan

[21] Appl. No.: 939,901

[22] Filed: Sep. 4, 1992

[30] Foreign Application Priority Data

Sep. 6, 1991 [JP] Japan .................. 3-227378

[51] Int. Cl.⁵ .............. H01S 3/18; H01S 3/08
[52] U.S. Cl. .................. 372/43; 372/45; 372/50; 372/19; 372/96
[58] Field of Search ............ 372/43, 44, 45, 46, 372/47, 48, 49, 50, 96, 19; 385/27, 28, 129, 130, 131, 132

[56] References Cited

U.S. PATENT DOCUMENTS

| | | | |
|---|---|---|---|
| 4,447,905 | 5/1984 | Dixon et al. | 372/46 |
| 4,546,479 | 10/1985 | Ishikawa et al. | 372/46 X |
| 4,546,480 | 10/1985 | Burnham et al. | 372/46 X |
| 4,575,851 | 3/1986 | Seki et al. | 372/96 X |
| 5,038,185 | 8/1991 | Thornton | 372/46 X |
| 5,153,890 | 10/1992 | Bona et al. | 372/48 |
| 5,260,230 | 11/1993 | Kondo | 372/43 X |

FOREIGN PATENT DOCUMENTS

| | | |
|---|---|---|
| 56-8889 | 1/1981 | Japan . |
| 56-112782 | 9/1981 | Japan . |
| 58-159388 | 9/1983 | Japan . |
| 2-60184 | 2/1990 | Japan . |

OTHER PUBLICATIONS

Hirata et al., *Electronic Letters* (Jun. 4, 1987) 23(12):627–628.

*Primary Examiner*—Brian Healy
*Attorney, Agent, or Firm*—Morrison & Foerster

[57] ABSTRACT

A semiconductor laser device with window regions according to the present invention is provided, in which a double hetero structure including cladding layers and an active layer sandwiched by the cladding layers is formed on a semiconductor substrate, the double hetero structure is buried in burying layers with a bandgap larger than that of the active layer, and the burying layers form window regions situated at both end facets of the double hetero structure, wherein the window regions have a waveguide structure including a plurality of semiconductor layers with different bandgaps.

6 Claims, 3 Drawing Sheets

SEMICONDUCTOR LASER DEVICE WITH WINDOW REGIONS

BACKGROUND OF THE INVENTION

1. Field of the Invention

The present invention relates to a semiconductor laser device with window regions, having a buried active region.

2. Description of the Prior Art

In recent years, semiconductor laser devices having advantages such as a small size, high output, and low price put to practical use. In the past, the use of a laser beam as a light source in general industrial and consumer equipment has been difficult. However, owing to the above-mentioned tendency, the application of laser devices to general industrial and consumer equipment have been increasing. It is expected that semiconductor laser devices will be applied in further various fields in the near future. Under the circumstances, semiconductor laser devices used as a light source for optical disk apparatuses are required to emit laser light with high output and to give high reliability.

It has been known that the high output operation of semiconductor laser devices cause defects due to the deterioration of crystals at cavity end facets in an active region. The reason for this is that a laser beam is absorbed by a surface state in the end facet to generate heat, and cause the crystal dislocation in the end facet. In order to overcome this problem, a semiconductor laser device with window regions is proposed. In this type of device, an active region including an active layer is buried in layers having a bandgap larger than that of the active layer.

A conventional typical semiconductor laser device is shown in FIG. 5 (Japanese Laid-Open Patent Publication No. 58-159388). FIG. 6 shows a cross-sectional view of the device taken along a line C-C' of FIG. 5. This semiconductor laser device is fabricated, for example, as follows:

As shown in FIG. 5, on an n-GaAs substrate 21, an n-AlGaAs cladding layer 22, an n-AlGaAs auxiliary cladding layer 23, a GaAs active layer 24, a p-AlGaAs auxiliary cladding layer 25, a p-AlGaAs cladding layer 26 and a p-GaAs contact layer 27 are successively grown by an appropriate crystal growth technique. Then, this layered structure is formed into a mesa-stripe by an appropriate etching technique, after which side faces and end facets are filled with an AlGaAs layer 28 with a bandgap larger than that of the active layer 24. At this time, the cladding layer 22, the auxiliary cladding layer 23, the active layer 24, the auxiliary cladding layer 25 and the cladding layer 26 form a Separate Confinement Heterostructure (SCH).

Moreover, a $Si_3N_4$ film 29 is formed on the contact layer 27, and then a portion of the $Si_3N_4$ film 29 positioned above the mesa-stripe is removed by etching to form a current injection path. Finally, a p-sided electrode 30 is formed on the exposed contact layer 27 portion and on the $Si_3N_4$ film 29 as shown in FIG. 6, and an n-sided electrode 31 is formed on the back surface of the substrate 21, thereby producing a semiconductor laser device with a window region as shown in FIG. 5. In the end facets of the active region, the layer 28 constitutes window regions, so that light is prevented from being absorbed by the surface state, and reliability can be remarkably improved.

However, in the above-mentioned conventional semiconductor laser device with window regions, when the layered structure is etched to form a mesa-stripe, a depth, i.e., the height of the mesa-stripe cannot be regulated because of the lack of means for limiting the etching depth. Light is reflected on the interface between the substrate 21 exposed by etching and the layer 28 to influence the properties of emitted light; however the properties of the emitted light cannot be regulated since the position of the interface cannot be specified. In the window regions, there are no waveguide structures for guiding a laser beam in vertical and horizontal directions. Because of this, the conventional semiconductor laser device with window regions has the following problems:

(1) Since the waveguide structures are not formed in the window regions, proportion coupling efficiency that light emitted from the internal waveguide in the active region is reflected on the end facet and fed back by coupling to the internal waveguide is small and the required laser gain cannot be obtained, leading to an increase in the threshold current.

(2) In the case where the etching depth for forming a stripe is small and an interface between the layer 28 and the substrate 21 is positioned in the vicinity of the active layer (as close as about 0.2 $\mu$m or less), and the thickness of the layer 28 is small, a laser beam is absorbed by the substrate 21 and the contact layer 27, causing distortion of a far-field pattern due to the waveguide loss and wave front distortion.

(3) Since there is no waveguide structure in a horizontal direction and there is wave front distortion in a vertical direction, positions of a beam waist of the window region waveguide in the horizontal direction and that of the window region in the vertical direction do not correspond to each other. This causes astigmatism.

SUMMARY OF THE INVENTION

In the semiconductor laser device with window regions of this invention, a double hetero structure including cladding layers and an active layer sandwiched by the cladding layers is formed on a semiconductor substrate, the double hetero structure is buried in burying layers with a bandgap larger than that of the active layer, and the burying layers form window regions situated at both end facets of the double hetero structure, wherein the window regions have a waveguide structure including a plurality of semiconductor layers with different bandgaps.

Thus, the invention described herein makes possible the advantage of providing a semiconductor laser device with window regions in which the waveguide mode of the internal active region and that of the window region correspond to each other with good controllability, and which has waveguides stable in both vertical and horizontal directions.

These and other advantages of the present invention will become apparent to those skilled in the art upon reading and understanding the following detailed description with reference to the accompanying figures.

DESCRIPTION OF THE PREFERRED EMBODIMENTS

A semiconductor laser device with window regions according to the present invention has a waveguide structure in the window regions. Each structure includes a plurality of semiconductor layers with different bandgaps; for example, a waveguide layer is sandwiched by cladding layers having a real number of complex refractive index smaller than that of the waveguide layer in this structure. Thus, a laser beam is not absorbed by the substrate or a contact layer, whereby the distortion of the far-field pattern caused by the wave front distortion can be prevented. Each waveguide of the window regions can be positioned with respect to an internal waveguide with good precision, so that a waveguide mode of an active region in a device and that of the window region correspond to each other with good controllability. Moreover, since waveguides stable in both vertical and horizontal directions are provided, a laser beam can be stably guided and high reliability can be obtained especially under high output operation.

A vertical direction for a waveguide mechanism can be formed of a real guide slab waveguide. In the real guide slab waveguide, the window region waveguide layer is sandwiched by the window region cladding layers having a real number of complex refractive index smaller than that of the window region waveguide layer, i.e., having a bandgap larger than that of a window region waveguide layer. In this case, a laser beam is not absorbed by the substrate nor the contact layer, so that the distortion of the far-field pattern caused by the wave front distortion can be prevented. Thus, it is particularly effective in the case where the internal waveguide and the window region waveguides are shifted to each other.

Because of the structure in which a plurality of semiconductor layers are formed, the position (with respect to the internal active region) and the size of the window region waveguide layer can be regulated with good precision by selective etching and by controlling the thickness thereof. Because of this, the waveguide mode of the internal waveguide and those of the window region waveguides correspond to each other with good precision, so that coupling efficiency between these modes becomes large and the distortion of the far-field pattern due to the generation of a radiation mode and the wave front distortion caused by the absorption of the laser beam into the substrate can be prevented.

The horizontal direction of the waveguide mechanism in the window regions can be formed of, for example, a ridge waveguide which can be readily produced. Because of this waveguide mechanism, a laser beam can also be stably guided in a horizontal direction.

EXAMPLES

Hereinafter, the present invention will be described by way of illustrating examples with reference to the drawings.

Figure 1:
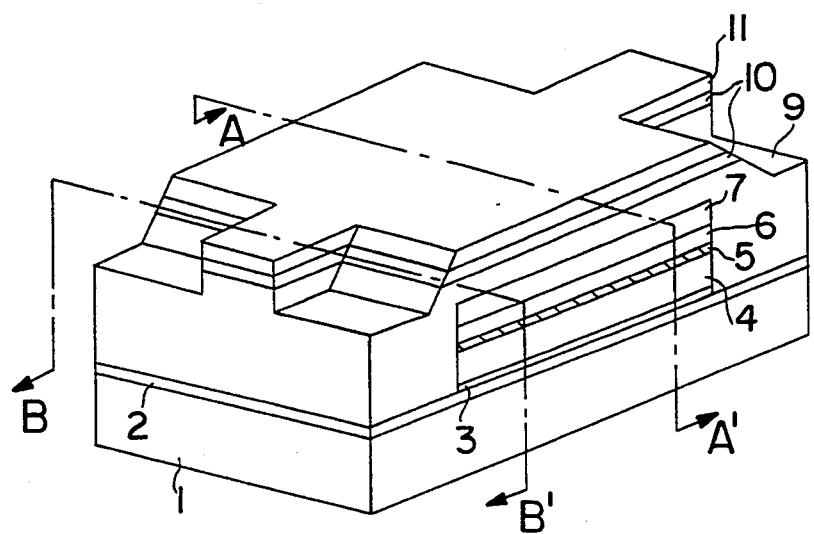
FIG. 1 is a perspective view showing an example of a semiconductor laser device with window regions according to the present invention.
Figure 2:
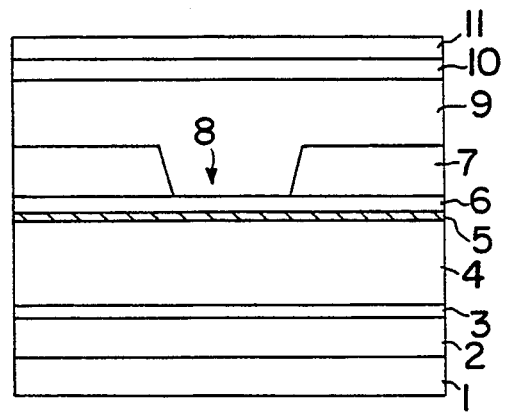
FIG. 2 is a cross-sectional view of the semiconductor laser device with window regions, taken along a line A-A' of FIG. 1.
Figure 3:
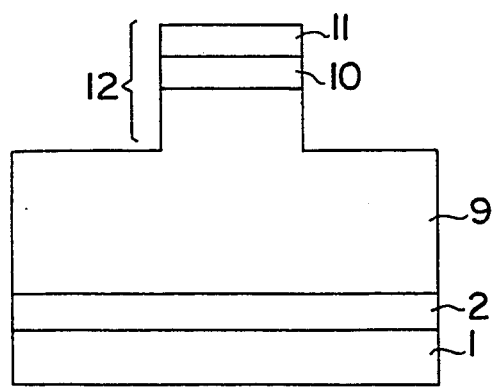
FIG. 3 is a cross-sectional view of the semiconductor laser device with window regions, taken along a line B-B' of FIG. 1.

A schematic view of an example of a semiconductor laser device with window regions according to the present invention is shown in FIG. 1. FIGS. 2 and 3 are cross-sectional views taken along lines A-A' and B-B' of FIG. 1, respectively. FIGS. 2 and 3 show a cross-sectional view of the device and that of a window region thereof, respectively. This type of semiconductor laser device is fabricated in the following manner.

First, an n-$Al_{0.7}Ga_{0.3}As$ window region cladding layer 2, an n-$Al_{0.2}Ga_{0.8}As$ etching stop layer 3, an n-$Al_{0.5}Ga_{0.5}As$ cladding layer 4, an $Al_{0.13}Ga_{0.87}As$ active layer 5, a p-$Al_{0.5}Ga_{0.5}As$ cladding layer 6, and an n-GaAs layer to be current confinement layers 7 are successively grown on a (001) surface of an n-GaAs substrate 1.

Then, as shown in FIG. 2, the n-GaAs layer is selectively etched in a [110] direction until the cladding layer 6 is exposed, whereby current confinement layers 7 and a stripe-shaped channel 8 with a width of 4 $\mu$m are formed. Moreover, the current confinement layers 7, the cladding layer 6, the active layer 5, the cladding layer 4, and the etching stop layer 3 are selectively etched in the [1$\bar{1}$0] direction, leaving an internal active region (with a length of about 300 $\mu$m) until the window region cladding layer 2 is exposed. The internal active region includes: a double hetero structure in which the cladding layer 6, the active layer 5 and the cladding layer 4 are formed; the current confinement layers 7; and the etching stop layer 3. In this way, grooves with a width corresponding to a length of 5 $\mu$m of the window region is formed in the [1$\bar{1}$0] direction. At this time, an $NH_4OH$ type etchant which etches only an $Al_xGa_{1-x}As$ ($x \leq 0.4$) layer with a small Al mixed crystal ratio, and an HF type etchant which etches only an $Al_xGa_{1-x}As$ ($x \geq 0.5$) layer with a large Al mixed crystal ratio are selectively and alternately used.

Furthermore, a p-$Al_{0.3}Ga_{0.7}As$ window region waveguide layer 9 is grown on the window region cladding layer 2 and the current confinement layers 7 so as to fill stripe-shaped channel 8 and the above-mentioned grooves. After that, a p-$Al_{0.5}Ga_{0.5}As$ window region cladding layer 10 and a p-GaAs contact layer 11 are successively grown on the window region waveguide layer 9. The above-mentioned internal active region including the active layer 5 is buried in the window region waveguide layer 9. Here, the window region waveguide layer 9, the window region cladding layer 10, and the contact layer 11 form burying layers. The double hetero structure is buried in the burying layers. Then, as shown in FIG. 3, respective ridges 12 are formed in the respective window regions so that their center positions correspond to that of the stripe-shaped channel 8 of the internal active region. A vertical direction for a waveguide mechanism is formed of a real guide slab waveguide and a horizontal direction thereof is formed of a ridge waveguide. In the real guide slab waveguide, the window region waveguide layer 9 is sandwiched by the window region cladding layers 2 and 10 having a real number of complex refractive index smaller than that of the window region waveguide layer 9, i.e., having a bandgap larger than that of the window region waveguide layer 9. The ridge waveguide includes the ridge 12 whose equivalent refractive index on both sides thereof is small. Thus, a laser beam can be guided so that a wave front thereof is not bent.

In the semiconductor laser device with window regions fabricated as described above, a laser beam is produced in the internal active region in FIG. 2, and then is guided to the window region waveguide layer 9 in FIG. 3. Part of the laser beam is emitted from one end facet of the window regions, and the remaining laser beam is reflected from the end facet so as to be used for the amplification of the laser beam. In compliance with an application, a laser beam can be emitted from both end facets instead of one end facet.

In the above example, a Fabrey-Pérot type semiconductor laser device is described; however, the present invention can be applied to a distributed feedback semiconductor laser device as shown in FIGS. 4a to 4d.

Figure 4A:
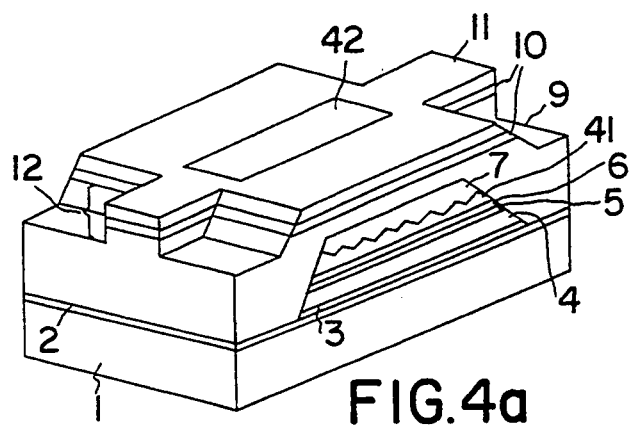
FIGS. 4a to 4d are perspective views showing the production of another example of a semiconductor laser device with window regions according to the present invention.

In this laser device, as shown in FIG. 4a, on a p-$Al_{0.5}Ga_{0.5}As$ cladding layer 6, a p-$Al_{0.25}Ga_{0.75}As$ diffraction grating engraved layer 41 and current confinement layers 7 are formed in this order. In this case, each interface between the internal active region and the respective window regions is made so as to be inclined, and the reflectance of the laser beam into the internal active region becomes approximately zero, so that the Fabrey-Pérot mode can be effectively controlled. The other portions are the same as in FIG. 1.

Figure 4B:
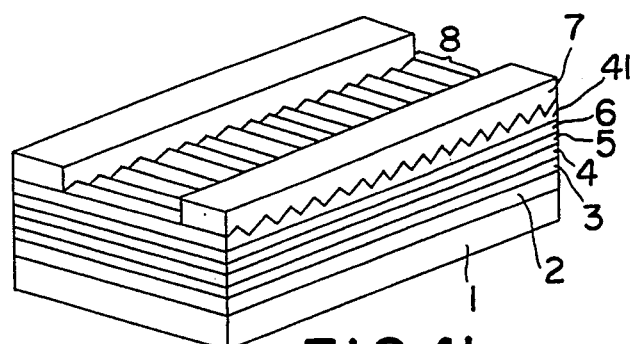
Figure 4C:
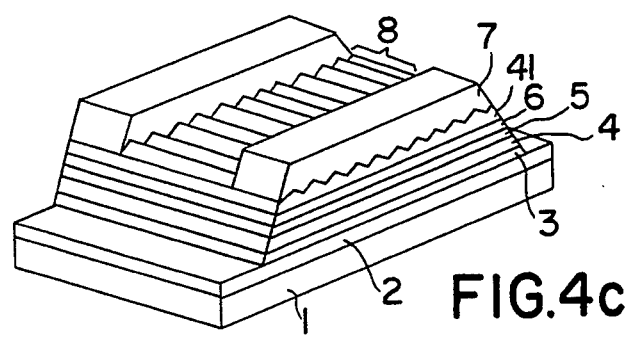
Figure 4D:
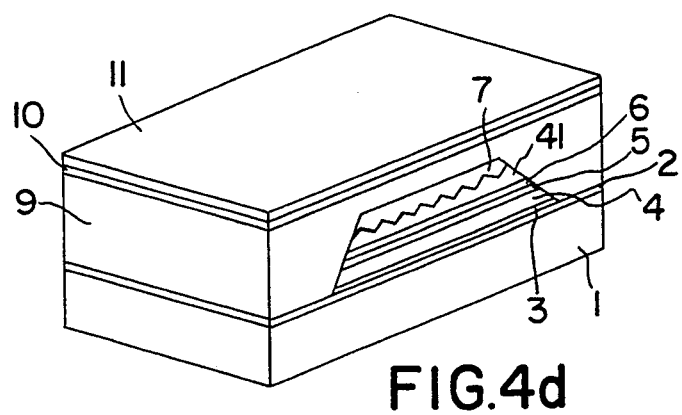
Figure 5:
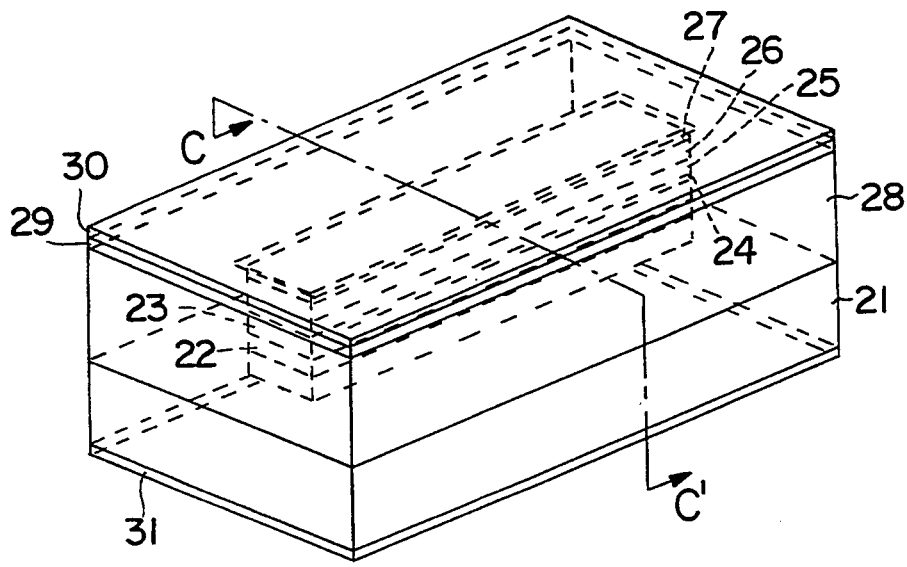
FIG. 5 is a perspective view showing a conventional semiconductor laser device with window regions.
Figure 6:
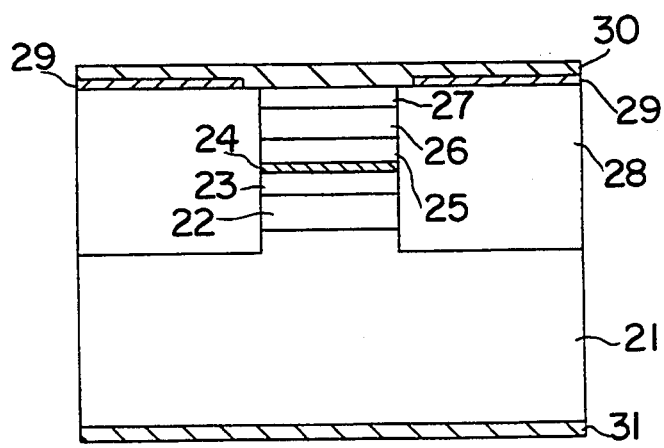
FIG. 6 is a cross-sectional view of the semiconductor laser device with window regions, taken along a line C-C' of FIG. 5.

This laser device is fabricated as follows: As shown in FIG. 4b, on a (001) n-GaAs substrate, an n-$Al_xGa_{1-x}As$ (x=0.7) window region cladding layer 2, an n-$Al_xGa_{1-x}As$ (x=0.2) etching stop layer 3, an n-$Al_xGa_{1-x}As$ (x=0.5) cladding layer 4, an AlGaAs active layer 5, and a p-$Al_xGa_{1-x}As$ (x=0.5) cladding layer 6 are successively grown. Then, a thin layer made of p-$Al_xGa_{1-x}As$ (x=0.25) is grown on the resulting layered structure, and a diffraction grating is engraved in this thin layer to form a diffraction grating engraved layer 41. A p-GaAs layer to be current confinement layers 7 is formed. A channel 8 with a width of 4 μm is engraved in the p-GaAs layer in a [110] direction until the diffraction grating engraved layer 41 is exposed (FIG. 4b), whereby current confinement layers 7 are formed. As shown in FIG. 4c, grooves with a width corresponding to a length (about 5 μm) of the window region are formed in a [1$\bar{1}$0] direction until the etching stop layer 3 is exposed, leaving an internal active region (with a length of about 300 μm). The internal active region includes: a double hetero structure in which the cladding layer 4, the active layer 5, and the cladding layer 6 are formed; the diffraction grating engraved layer 41; the current confinement layers 7; and the etching stop layer 3. Then, the etching stop layer 3 in the grooves is removed. As shown in FIG. 4d, on the resulting substrate 1, a p-$Al_yGa_{1-y}As$ (y=0.3) window region waveguide layer 9, a p-$Al_yGa_{1-y}As$ (y=0.5) window region cladding layer 10, and a p-GaAs contact layer 11 are grown. Here, the window region waveguide layer 9, the window region cladding layer 10, and the contact layer 11 form burying layers. The double hetero structure is buried in the burying layers. Then, as shown in FIG. 4a, respective ridges 12 are formed in the respective window regions so as to correspond to the channel 8 in the internal active region. The window region waveguide structures are formed of a three-layered (the window region cladding layer 2, the window region waveguide layer 9, and the window region cladding layer 10) slab waveguide in a vertical direction and a ridge waveguide in a horizontal direction. Also, since it is not necessary for current to flow in the window region, an electrode 42 may be provided only in the active region.

Moreover, in the above example, the semiconductor laser device in which the substrate is made of GaAs and the other portions are made of AlGaAs mixed crystal is described; however, the present invention is not limited thereto. For example, the present invention can be applied to a semiconductor laser device in which the substrate is made of GaAs and the other portions are made of GaInPAs mixed crystal or AlGaInP mixed crystal. Furthermore, the present invention can be applied to a semiconductor laser device in which the substrate is made of InP and the other portions are made of GaInPAs mixed crystal.

According to the present invention, a semiconductor laser device with window regions, in which waveguide modes satisfactorily correspond to each other between the internal active region and the respective window regions, can be obtained. In this type of semiconductor laser device, coupling efficiency between the internal waveguide mode and the window region waveguide mode corresponding thereto is great. Moreover, this type of semiconductor laser device uses a real guide slab type waveguide, so that there is no distortion of a far-field pattern due to the generation of a radiation mode and the wave front distortion caused by the absorption of the laser beam into the substrate. Furthermore, a laser beam can be stably guided in both vertical and horizontal directions, so that high reliability can be obtained under high output operation. Thus, the semiconductor laser device according to the present invention can be widely used for optical communication and as a light source for optical disks.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device with window regions, in which a double hetero structure including cladding layers and an active layer sandwiched by the cladding layers is formed on a semiconductor substrate, the double hetero structure is buried in burying layers with a bandgap larger than that of the active layer, and the burying layers form window regions situated at both end facets of the double hetero structure, wherein the window regions have a waveguide structure including a plurality of semiconductor layers with different bandgaps, wherein the plurality of semiconductor layers in the window regions comprise a window region waveguide layer and window region cladding layers which are provided above and below the window region wave guide layer and which have a bandgap larger than that of the window region waveguide layer, and further wherein the window region waveguide layer is provided so that the position and size thereof correspond to those of the active layer, and a waveguide mode of the active layer and that of the window region waveguide layer match with each other.

2. A semiconductor laser device with window regions according to claim 1, wherein two current confinement layers are formed at a distance on one of the cladding layer of the double hetero structure, and one ridge is positioned in the respective window regions, corresponding to a current confinement portion between the two current confinement layers.

3. A semiconductor laser device with window regions according to claim 1, which is a distributed feedback semiconductor laser device.

4. A semiconductor laser device with window regions according to claims 1 or 3, wherein the substrate of the semiconductor laser device with window regions is made of GaAs and the other portions are made of AlGaAs mixed crystal, GaInPAs mixed crystal or AlGaInP mixed crystal.

5. A semiconductor laser device with window regions according to claims 1 or 3, wherein the substrate of the semiconductor laser device with window regions is made of InP and the other portions are made of GaInPAs mixed crystal.

6. A semiconductor laser device with window regions, in which a double hetero structure including cladding layers and an active layer sandwiched by the cladding layers is formed on a semiconductor substrate, the double hetero structure is etched at both ends and buried in burying layers with a bandgap larger than that of the active layer, and the burying layers form window regions situated at both end facets of the double hetero structure, wherein the window regions have a waveguide structure including a plurality of semiconductor layers with different bandgaps, and wherein the window region waveguide layer is provided so that the position and size thereof correspond to those of the active layer, thereby matching waveguide mode of active region coincides with wave guide mode of window region.

* * * * *